United States Patent
Kyung et al.

(10) Patent No.: US 7,167,407 B2
(45) Date of Patent: Jan. 23, 2007

(54) DYNAMIC SEMICONDUCTOR MEMORY DEVICE AND POWER SAVING MODE OF OPERATION METHOD OF THE SAME

(75) Inventors: Kye-Hyun Kyung, Yongin-si (KR); Kyu-Han Han, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/015,391

(22) Filed: Dec. 16, 2004

(65) Prior Publication Data

US 2005/0162964 A1    Jul. 28, 2005

(30) Foreign Application Priority Data

Dec. 31, 2003    (KR)    .................. 10-2003-0101575

(51) Int. Cl.
*G11C 7/00*    (2006.01)
(52) U.S. Cl. .................. 365/222; 365/227; 365/228; 365/229
(58) Field of Classification Search ............... 365/222, 365/227, 228, 229
See application file for complete search history.

(56) References Cited

U.S. PATENT DOCUMENTS

| | | | | |
|---|---|---|---|---|
| 4,313,180 A | * | 1/1982 | Mochizuki et al. | ......... 365/222 |
| 4,792,891 A | * | 12/1988 | Baba | ............................. 711/1 |
| 5,148,546 A | * | 9/1992 | Blodgett | ...................... 713/320 |
| 5,283,764 A | * | 2/1994 | Kim et al. | .................. 365/222 |
| 5,828,610 A | * | 10/1998 | Rogers et al. | .............. 365/203 |
| 6,097,662 A | * | 8/2000 | Itou | ....................... 365/230.03 |
| 6,288,963 B1 | * | 9/2001 | Kato | .......................... 365/222 |
| 6,449,182 B1 | * | 9/2002 | Ooishi | .......................... 365/63 |
| 6,452,859 B1 | * | 9/2002 | Shimano et al. | ........ 365/230.06 |

\* cited by examiner

*Primary Examiner*—Richard Elms
*Assistant Examiner*—Eric J. Wendler
(74) *Attorney, Agent, or Firm*—Marger Johnson & McCollom, P.C.

(57) ABSTRACT

A dynamic semiconductor memory device includes a memory cell array including a plurality of memory cells connected between a plurality of word lines and a plurality of bit line pairs. A mode setting portion receives a mode setting code applied from an external portion to generate a power saving mode control signal for a power saving mode of operation responsive to a mode setting command. An address control portion decodes an address applied from an external portion or a refresh address to select one of the plurality of the word lines during a normal mode operation. The address control portion also selects a predetermined number of bits of the address during a power saving mode of operation. The semiconductor memory device, therefore extends the refresh cycle while reducing the refresh time resulting in a lower power consumption.

10 Claims, 6 Drawing Sheets

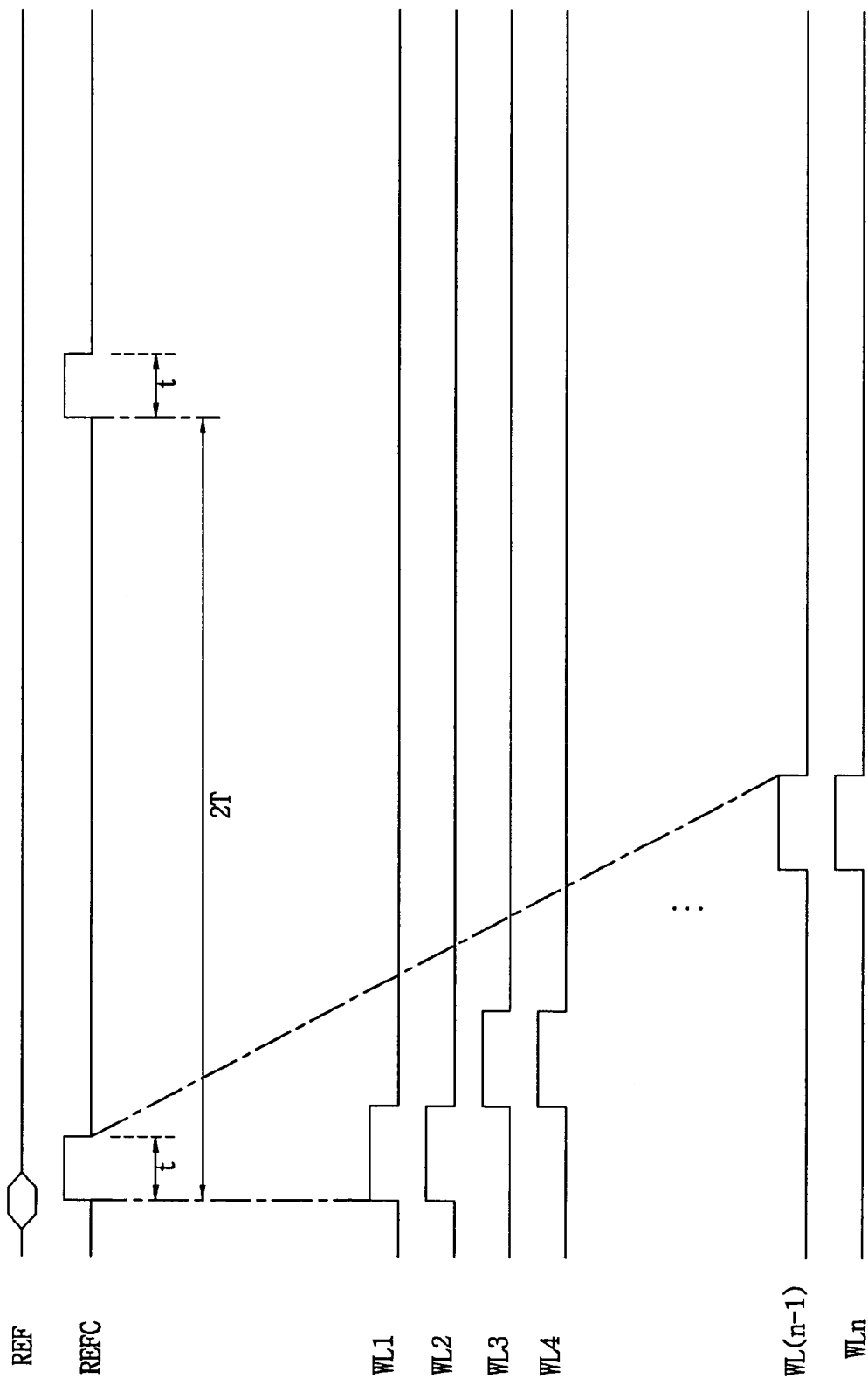

DYNAMIC SEMICONDUCTOR MEMORY DEVICE AND POWER SAVING MODE OF OPERATION METHOD OF THE SAME

CROSS-REFERENCE TO RELATED APPLICATION

This application claims priority from Korean Patent Application No. 2003-101575, filed Dec. 31, 2003, the disclosure of which is incorporated by reference in its entirety.

BACKGROUND OF THE INVENTION

1. Field of the Invention

The present invention relates to a dynamic semiconductor memory device and, more particularly, to a dynamic semiconductor memory device that reduces power consumption and an associated method for reducing power consumption.

2. Description of the Related Art

A dynamic semiconductor memory device performs refresh and read and write operations.

A dynamic cell of the dynamic semiconductor memory device includes one transistor and one capacitor to store a 1-bit data. A data "high" stored in the capacitor is lost as time lapses. A refresh operation is periodically performed to maintain the data before the data "high" is lost.

A conventional dynamic semiconductor memory device should perform a periodic refresh operation even in a standby state, when write and read operations are not performed, leading to high power consumption.

When the conventional dynamic semiconductor memory device is used in a mobile communication terminal that uses a battery as a power source, the battery cannot be used for a long time periods because the refresh operation has such a high power consumption.

SUMMARY OF THE INVENTION

It is an object of the present invention to provide a dynamic semiconductor memory device having a low power consumption.

It is another object of the present invention to provide a method for reducing power consumption in a dynamic semiconductor memory device.

In order to achieve the objects, the present invention provides a dynamic semiconductor memory device that includes a memory cell array with a plurality of memory cells coupled between a plurality of word lines and a plurality of bit line pairs. A mode setting means generates a power saving mode control signal responsive to a mode setting command. An address control means concurrently selects a predetermined number of word lines associated with an address responsive to the power saving control signal.

The present invention further provides a method of operating a dynamic semiconductor memory including generating a power saving mode signal to define a power saving mode of operation. The method generates a refresh control signal. The method increases the refresh control signal period responsive to the power saving mode signal. The method calculates the entire refresh address during a normal mode of operation. The method calculates all but a predetermined number of bits of the refresh address during a power saving mode of operation. The method selects the input address or the refresh address responsive to a refresh command. The method selects one word line responsive to the selected address during the normal mode of operation. And the method selects at least one word line responsive to the selected address during the power saving mode of operation where the number of word lines selected is equal to the predetermined number of bits.

BRIEF DESCRIPTION OF THE DRAWINGS

The above and other features and advantages of the present invention will become more apparent to those of ordinary skill in the art by describing in detail preferred embodiments with reference to the following drawings.

FIG. 6 is a timing diagram of a refresh operation of the dynamic semiconductor memory device of FIG. 5 during a power saving mode of operation.

DETAILED DESCRIPTION OF THE INVENTION

The present invention will now be described more fully with reference to the accompanying drawings, in which preferred embodiments of the invention are shown. This invention may, however, be embodied in different forms and should not be construed as limited to the embodiments set forth here. Rather, these embodiments are provided so this disclosure will be thorough and complete, and will fully convey the scope of the invention to those skilled in the art. Like numbers refer to like elements throughout the specification.

Figure 1:
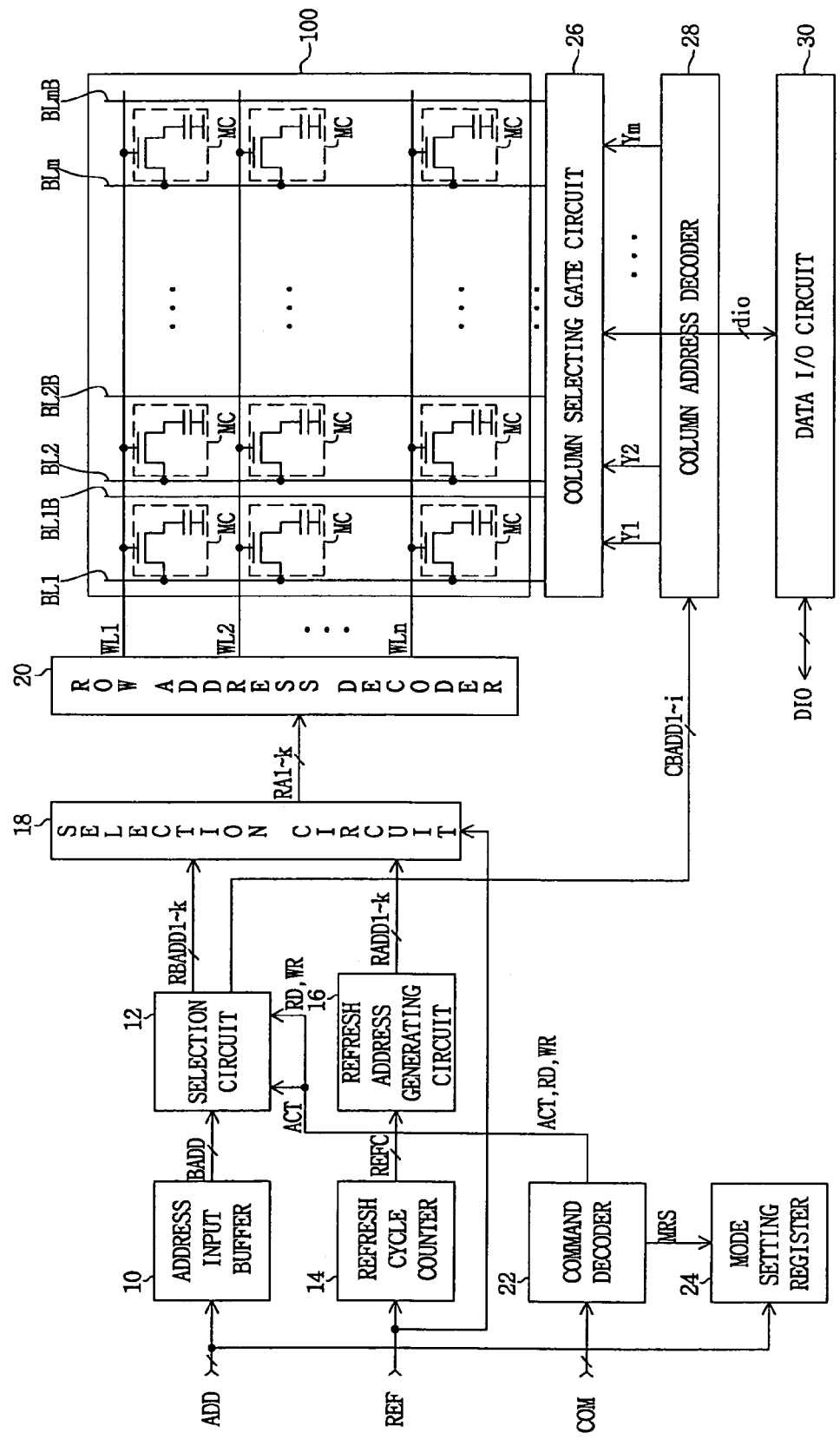
FIG. 1 is a block diagram of a conventional dynamic semiconductor memory device.

FIG. 1 is a block diagram of a conventional dynamic semiconductor memory device. The dynamic semiconductor memory device of FIG. 1 includes an address input buffer 10, selection circuits 12 and 18, a refresh cycle counter 14, a refresh address generating circuit 16, a row address decoder 20, a command decoder 22, a mode setting register 24, a column selecting gate circuit 26, a column address decoder 28, a data I/O circuit 30, and a memory cell array 100.

The dynamic semiconductor memory device of FIG. 1 operates as follows.

The memory cell array 100 includes memory cells MC connected between word lines WL1 to WLn and bit line pairs BL1, BL1B to BLm, BLmB to store data. The address input buffer 10 buffers an externally applied address ADD to generate buffered address BADD. The selection circuit 12 receives the buffered address BADD to generate k bits of a buffered row address RBADD1~k responsive to an active command ACT or to generate I bits of a buffered column address CBADD1~i responsive to a read command RD and a write command WR. The refresh cycle counter 14 generates a control signal REFC responsive to a internally generated refresh command REF. The refresh address generating circuit 16 generates k bits of refresh address RADD1~k responsive to the refresh control signal REFC. The selection circuit 18 selects k bits of the buffered row address RBADD1~k or k bits of refresh address RADD1~k to output k bits of address RA1~k responsive to the refresh command REF. The row address decoder 20 decodes the k bits of address RA1~k outputted from the selection circuit 18 to one of the word lines WL1 to WLn. The command decoder 22 decodes an externally applied command COM to generate an active command ACT, a write command WR, a read command RD, and a mode setting command MRS. The mode setting register 24 receives a mode setting code to generate control signals which are used to control an internal operation responsive to a mode setting command MRS. FIG. 1 shows a case in which the mode setting code is inputted through an address ADD input terminal. The column selecting gate circuit 26 receives/outputs data from/to a selected bit line pair among BL1, BL1B to BLm, BLmB responsive to column selecting signals Y1 to Ym. The column address decoder 28 decodes the i bits of buffered column address CBADD1~i to generate the column selecting signals Y1 to Ym. The data I/O circuit 30 receives data dio and outputs data DIO.

The conventional dynamic semiconductor memory device of FIG. 1 receives/outputs data from/to the memory cells connected between one selected word line and a predetermined number of bit line pairs during write and read operations, and refreshes data stored in the memory cell array 100 during a refresh operation.

Figure 2:
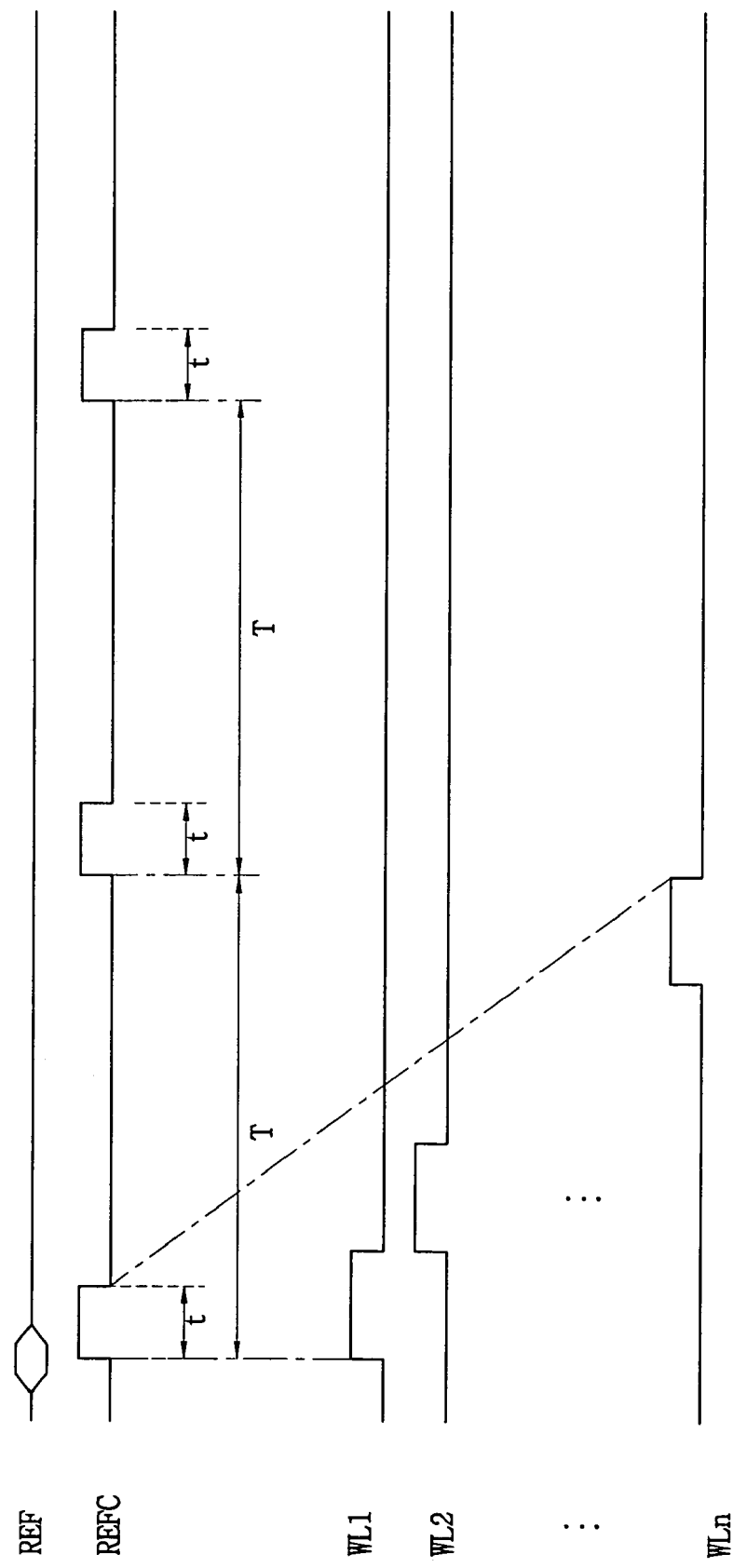
FIG. 2 is a timing diagram of a refresh operation of the conventional dynamic semiconductor memory device of FIG. 1.

FIG. 2 is a timing diagram of a refresh operation of the conventional dynamic semiconductor memory device of FIG. 1.

The refresh cycle counter 14 generates the refresh control signal REFC having a cycle T and a pulse width t responsive to the refresh command REF. The pulse width t is a time spent to select all of the word lines WL1 to WLn of the memory cell array 100. The refresh address generating circuit 16 generates the k bits of the refresh address RADD1~k that increase sequentially responsive to the refresh control signal REFC. The k bits of the refresh address RADD1~k are selected and decoded by the selection circuit 18 and the row address decoder 20 to select the word lines WL1 to WLn sequentially one at a time. Then data of the memory cells MC connected to the selected word lines are read to the bit line pairs BL1, BL1B to BLm, BLmB. The read data are amplified by bit line sense amplifiers (not shown) before being stored in the corresponding memory cells MC again.

The conventional dynamic semiconductor memory device should perform a refresh operation during a time period with a pulse width t in a refresh cycle T and thus has high power consumption.

Figure 3:
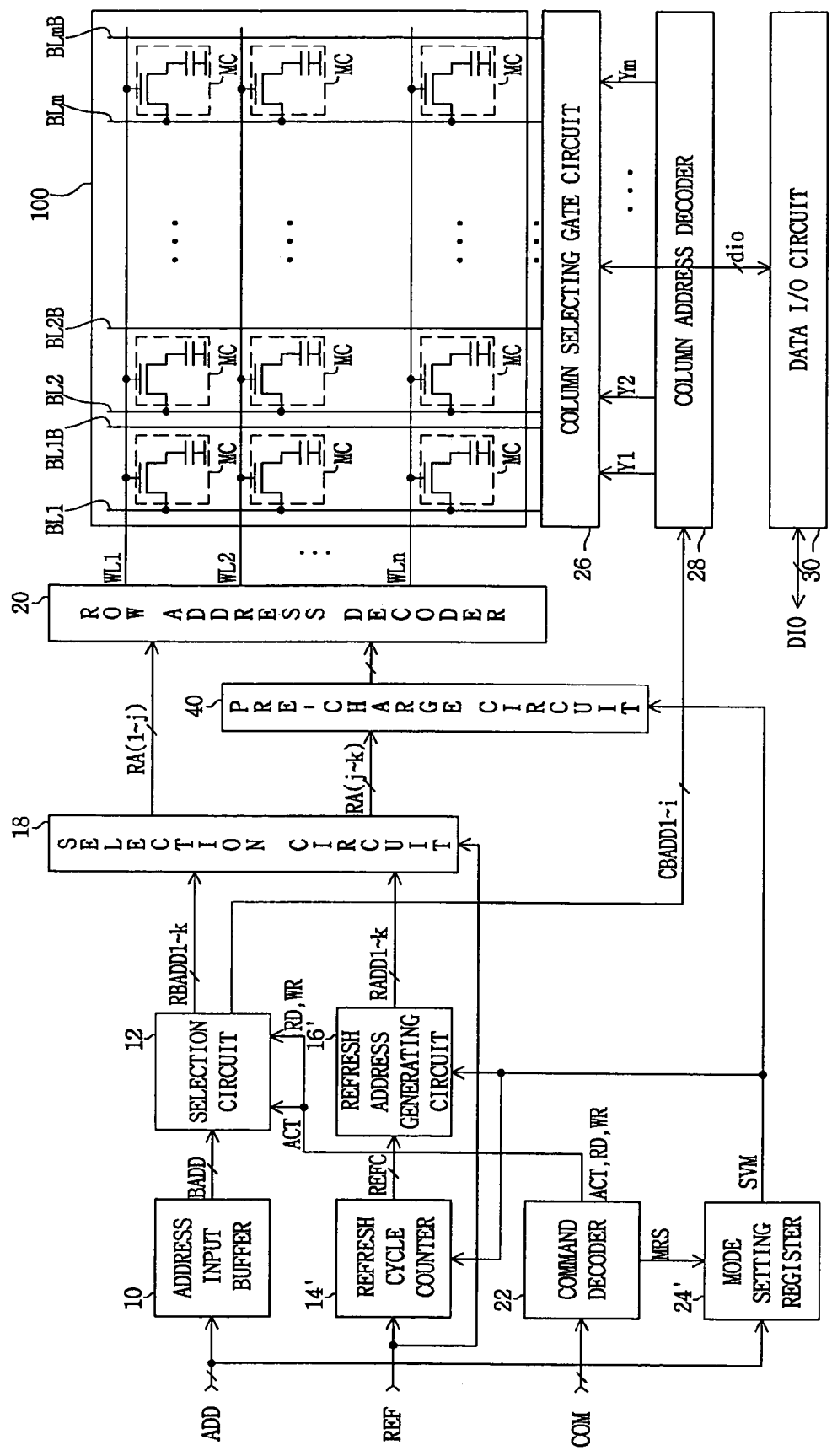
FIG. 3 is a block diagram of a dynamic semiconductor memory device according to an embodiment of the present invention.

FIG. 3 is a block diagram of a dynamic semiconductor memory device according to an embodiment of the present invention. The dynamic semiconductor memory device of FIG. 3 has a similar configuration to that of FIG. 1 except that a pre-charge circuit 40 is added, and the refresh cycle counter 14, the refresh address generating circuit 16, and the mode setting register 24 are substituted with a refresh cycle counter 14', a refresh address generating circuit 16' and a mode setting register 24', respectively.

Like reference numerals of FIGS. 1 and 3 denote like parts and perform like operation, and thus descriptions of those are omitted.

The mode setting register 24' receives a mode setting code to generate control signals to control internal operation and a power saving mode control signal SVM for a power saving mode of operation responsive to a mode setting command MRS. The refresh cycle counter 14' generates a refresh control signal REFC having a normal refresh cycle and a normal pulse width responsive to the refresh command REF during a normal operation and generates a refresh control signal REFC having a refresh cycle longer than the normal refresh cycle and a pulse width narrower than the normal pulse width responsive to the power saving mode control signal SVM during a power saving mode of operation. The refresh address generating circuit 16' generates k bits of refresh address RADD1~k responsive to the refresh control signal REFC during normal operation. While in a power saving mode of operation the refresh address generating circuit 16' calculates the upper bits of the address except for a predetermined number of lower address bits to generate j bits of refresh address RADD1~j responsive to the refresh control signal REFC and the power saving mode control signal SVM. The pre-charge circuit 40 pre-charges the lower bits of the address outputted from the selection circuit 18 to "high" responsive to the power saving mode control signal SVM.

The dynamic semiconductor memory device of FIG. 3 selects one word line to perform a write operation, a read operation and a refresh operation during normal operation like the conventional one, but simultaneously selects a predetermined number of word lines to perform a write operation, a read operation and a refresh operation during a power saving mode of operation.

Hence, the dynamic semiconductor memory device of the present invention simultaneously selects a predetermined number of memory cells to write/read and refresh the same data to/from a predetermined number of memory cells, whereby a capacitance of the memory cell that stores one bit of data is increased. For example, if the dynamic semiconductor memory device is designed such that the pre-charge circuit 40 pre-charges the lowest bit address among the k bits of the buffered row address RBADD1~k outputted from the selection circuit 18 to "high", the row address decoder 20 decodes the (k−1) bits of the buffered row address RBADD1~(k−1) and the lowest bit address RBADDk to sequentially select the word lines WL1 to WLn two at a time. As a result, each of the memory cells has twice the capacitance as that of the conventional semiconductor memory device.

Thus, it takes twice as long for each of the memory cells of the inventive dynamic semiconductor memory device to lose data as compared to the conventional dynamic semiconductor memory device, allowing a refresh cycle period to double. Put differently, if the conventional dynamic semiconductor memory device performs a refresh operation every T cycles, the dynamic semiconductor memory device of the present invention may perform a refresh operation every 2T cycles.

And, the dynamic semiconductor memory device of the present invention simultaneously selects two word lines during a refresh operation, and thus a refresh time required to refresh all of the word lines is halved. As a result, a pulse width of the refresh control signal REFC can be reduced to half that of conventional operation.

Consequently, the dynamic semiconductor memory device of the present invention has a lower power consumption because a refresh cycle period is increased and a refresh time is reduced.

Figure 4:
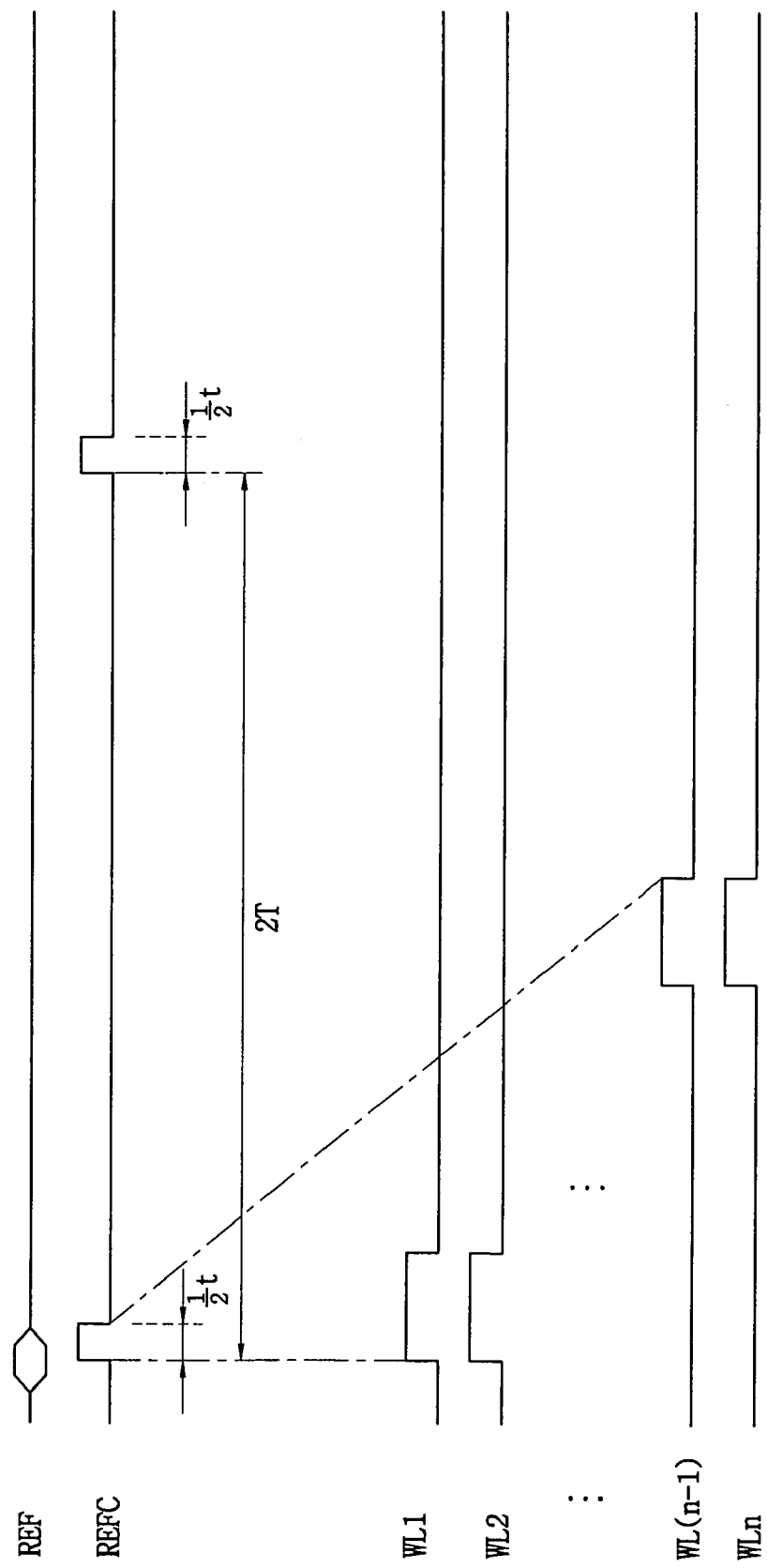
FIG. 4 is a timing diagram of a refresh operation of the dynamic semiconductor memory device of FIG. 3 during a power saving mode of operation.

FIG. 4 is a timing diagram of a refresh operation of the dynamic semiconductor memory device of FIG. 3 during a power saving mode of operation. In particular, FIG. 4 shows a refresh operation when the lowest bit of the address RAk is pre-charged to "high" during a power saving mode of operation.

The mode setting register 24' receives a mode setting code to set a power saving mode to generate the power saving mode control signal SVM responsive to the mode setting command MRS. The refresh cycle counter 14' generates the refresh control signal REFC having a refresh cycle 2T and a pulse width t/2 responsive to the refresh command REF during a refresh operation. The refresh address generating circuit 16' calculates all of the bits of the address except the lowest bit to generate the (k−1) bits of refresh address RADD1~(k−1) responsive to the refresh control signal REFC and the power saving mode control signal SVM. The selection circuit 18 selects the (k−1) bits of refresh address RADD1~(k−1) and outputs the (k−1) bits of address RA1~(k−1). The row address decoder 20 decodes the (k−1) bits of address RA1~(k−1) and the lowest bit of the address RAk that is pre-charged to "high" to sequentially select the word lines WL1 to WLn two at a time. The memory cell array 100 performs a refresh operation that reads data of the memory cells MC connected to the selected word line to the bit line pairs BL1,BL1B to BLm,BLmB, and amplifies the data by the bit line sense amplifier (not shown) before re-storing the data in the corresponding memory cells MC.

As can be seen in FIG. 4, during a power saving mode of operation, a cycle of the refresh control signal REFC is 2T and a pulse width is t/2, reducing power consumption during a refresh operation. If power consumption for one refresh operation in the conventional dynamic semiconductor memory device is P, power consumption for one refresh operation in the dynamic semiconductor memory device of this exemplary embodiment of the present invention is P/4.

If the dynamic semiconductor memory device is designed such that the (k−2) bits of address RA(k−2) and the remaining bits RAk are pre-charged to "high", a refresh cycle period is increased to 4T, and a refresh time is reduced to t/4, whereby reducing power consumption to P/16.

Figure 5:
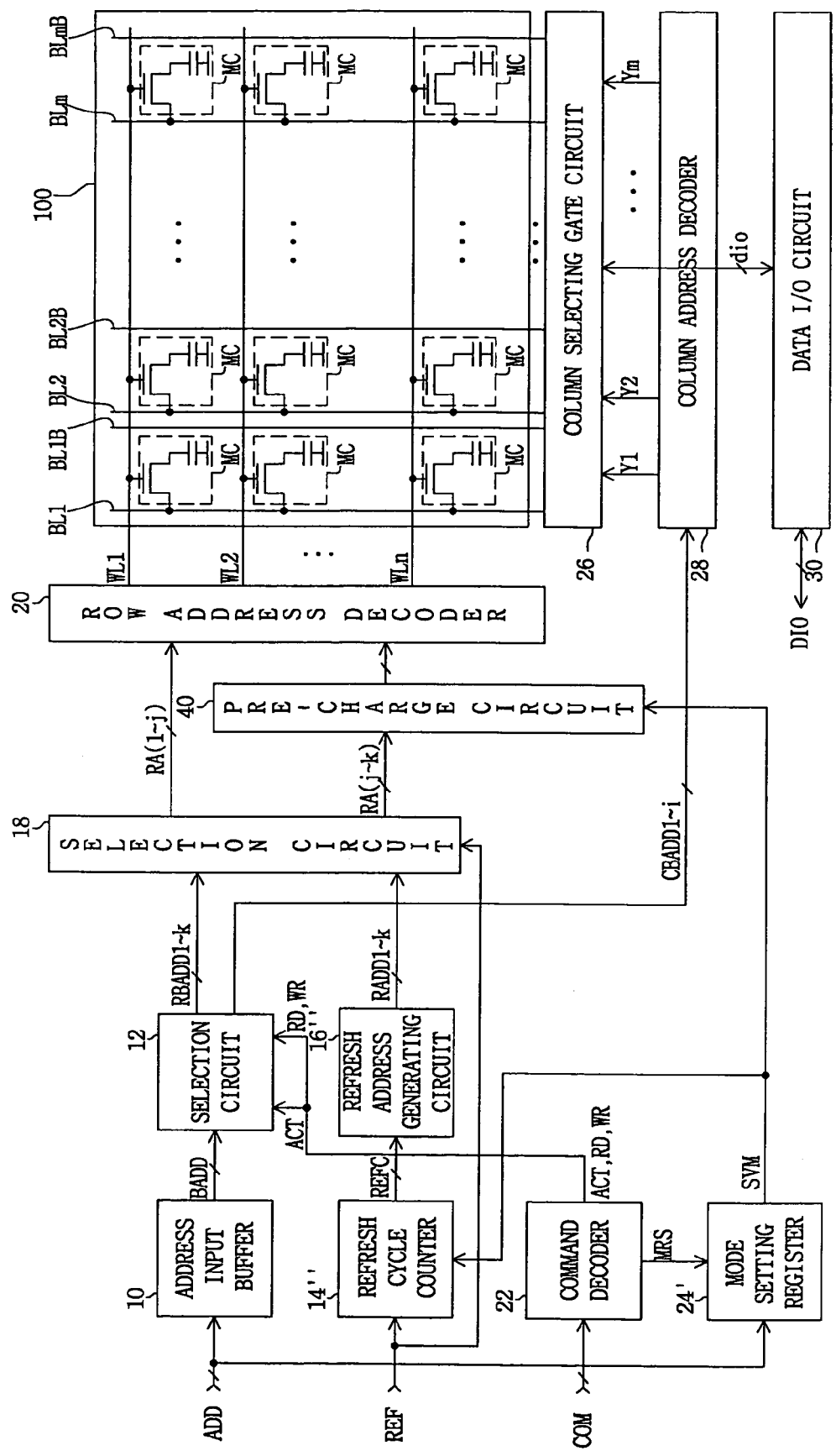
FIG. 5 is a block diagram of a dynamic semiconductor memory device according to another embodiment of the present invention.

FIG. 5 is a block diagram of a dynamic semiconductor memory device according to another embodiment of the present invention. The dynamic semiconductor memory device of FIG. 5 has a similar configuration to that of FIG. 3 except that the refresh cycle counter 14' and the refresh address generating circuit 16' are substituted with a refresh cycle counter 14" and a refresh address generating circuit 16".

Like reference numerals of FIGS. 3 and 5 denote like parts and perform like operation, and thus descriptions of those are omitted.

The refresh cycle counter 14" generates a refresh control signal REFC having a normal refresh cycle and a normal pulse width responsive to the refresh command REF during normal operation. The refresh cycle counter 14" also generates a refresh control signal REFC having a longer refresh cycle than the normal refresh cycle responsive to the power saving mode control signal SVM during a power saving mode of operation. The refresh address generating circuit 16" generates k bits of refresh address RADD1~k responsive to the refresh control signal REFC. That is, the refresh address generating circuit 16" performs the same operation as that the refresh address generating circuit 16 of FIG. 1.

The dynamic semiconductor memory device of FIG. 5 reduces the period of the refresh control signal REFC without reducing a pulse width during a power saving mode of operation.

Therefore, the dynamic semiconductor memory device of FIG. 5 may have twice power the consumption as that of FIG. 3 but has a half the power consumption as that of FIG. 1.

FIG. 6 is a timing diagram of a refresh operation of the dynamic semiconductor memory device of FIG. 5 during a power saving mode of operation. In particular, FIG. 4 shows a refresh operation when the lowest bit of the address RAk is pre-charged to "high" during a power saving mode of operation.

The refresh cycle counter 14" generates the refresh control signal REFC having a refresh cycle 2T and a pulse width t responsive to the refresh command REF during a refresh operation. The refresh address generating circuit 16" generates the k bits of the refresh address RADD1~k responsive to the refresh control signal REFC and the power saving mode control signal SVM. The selection circuit 18 receives the k bits the of refresh address RADD1~k to output the k bits of the address RA1~k. Because the lowest bit of the refresh address RADD1~k is pre-charged to "high" by the pre-charge circuit 40, the row address decoder 20 decodes the (k−1) bits of address RA1~(k−1) and the address RAk that is pre-charged to "high" sequentially select the word lines WL1 to WLn two at a time. The memory cell array 100 performs a refresh operation that reads data of the memory cells MC connected to the selected word line to the bit line pairs BL1, BL1B to BLm, BLmB, and amplifies the read data by the bit line sense amplifier (not shown) before re-storing the data in the corresponding memory cells MC.

As can be seen in FIG. 6, during a power saving mode of operation, a cycle of the refresh control signal REFC is 2T and a pulse width is t, whereby reducing power consumption during a refresh operation is reduced. If a power consumption required for one time refresh operation in the conventional dynamic semiconductor memory device is P, power consumption required for one refresh operation in this embodiment of the dynamic semiconductor memory device of the present invention is P/2.

The above-described embodiment is described by using a configuration that the bit number of the row address pre-charged to "high" during a power saving mode of operation is fixed, but the dynamic semiconductor memory device can be configured to have a variable pre-charge bit number of the row addresses.

As described, the inventive dynamic semiconductor memory device and the power saving mode of operation method of simultaneously select a predetermined number of word lines to read data and to perform a refresh operation can thus extend a refresh cycle period, reduce refresh time, and reduce refresh operation power consumption.

Therefore, the dynamic semiconductor memory device of the present invention can be employed using a battery of a mobile communication terminal to reduce battery consumption.

We claim the following:

1. A dynamic semiconductor memory device comprising:
   a memory cell array including a plurality of memory cells coupled between a plurality of word lines and a plurality of bit line pairs;
   a mode setting means to receive an externally-applied mode setting code and to generate a power saving mode control signal responsive to the mode setting code; and
   an address control means including:
      a refresh control signal generating means to generate a refresh control signal responsive to a refresh command and to extend a period of the refresh control signal and to reduce a pulse width of the refresh control signal responsive to the power saving mode control signal;

a refresh address generating means to generate the refresh address responsive to the refresh control signal and to calculate the refresh address except the at least one predetermined bit responsive to the power saving mode control signal;

a selection means to select and to output the externally-applied address or the refresh address responsive to the refresh command; and an address decoding means to decode an address output from the selection means to select one of the plurality of word lines during the normal mode operation, pre-charge the at least one predetermined bit of the address, decode all but the at least one predetermined bit of the address output from the selection means, and pre-charge at least one predetermined bit of the address to simultaneously select at least two word lines among the plurality of word lines in response to the power saving mode control signal.

2. The device of claim 1 where the refresh control signal generating means is adapted to extend the period of the refresh control signal by n times and reduce a pulse width of the refresh control signal to 1/n times compared to that of normal operation; and where n is a number of simultaneously selected word lines.

3. The device of claim 1 where the at least one predetermined bit of the refresh address is a lower bit of the row address.

4. The device of claim 1 where the address decoding means includes a pre-charge circuit to pre-charge the at least one predetermined bit of the refresh address responsive to the power saving mode control signal.

5. The device of claim 1 where the refresh control signal generating means is adapted to extend the period of the refresh control signal by n times compared to that of normal operation when a number of the simultaneously selected word lines is n.

6. The device of claim 1 where the at least one predetermined bit of the refresh address is a lower bit of the address.

7. A method of operating a dynamic semiconductor memory comprising:

generating a power saving mode signal to define a power saving mode of operation;

generating a refresh control signal;

increasing the refresh control signal period and reducing the refresh control signal pulse width responsive to the power saving mode signal;

calculating the entire refresh address during a normal mode of operation;

calculating all but a predetermined number of bits of the refresh address during a power saving mode of operation;

selecting the input address or the refresh address responsive to a refresh command;

pre-charging a predetermined number of bits of the selected address during the power saving mode of operation;

selecting one word line responsive to the selected address during the normal mode of operation; and simultaneously selecting at least two word lines responsive to the selected address including the pre-charged predetermined number of bits during the power saving mode of operation where the number of word lines selected is proportional to the predetermined number of bits.

8. The method of claim 7 where increasing the refresh control signal period includes increasing the refresh control signal period n times compared to that of the normal mode of operation when the number of word lines that are simultaneously selected is n.

9. The method of claim 7 where calculating all but a predetermined number of bits includes calculating all but the lower bits of the refresh address.

10. The method of claim 7 where increasing the refresh control signal period includes increasing the refresh control signal period by n times compared to that of the normal mode of operation and reducing the refresh control signal pulse width includes reducing the refresh control signal pulse width by 1/n times compared to that of the normal mode of operation, where n is a number of word lines that are simultaneously selected.

* * * * *